(12) United States Patent
Ikuma et al.

(10) Patent No.: US 10,685,997 B2
(45) Date of Patent: Jun. 16, 2020

(54) SOLID-STATE IMAGING APPARATUS AND IMAGING APPARATUS

(71) Applicant: PANASONIC INTELLECTUAL PROPERTY MANAGEMENT CO., LTD., Osaka (JP)

(72) Inventors: Makoto Ikuma, Kyoto (JP); Hiroyuki Amikawa, Kyoto (JP); Takayasu Kito, Osaka (JP); Shinichi Ogita, Kyoto (JP); Junichi Matsuo, Osaka (JP); Yasuyuki Endoh, Hyogo (JP); Katsumi Tokuyama, Osaka (JP); Tetsuya Abe, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/431,302

(22) Filed: Jun. 4, 2019

(65) Prior Publication Data
US 2019/0289238 A1    Sep. 19, 2019

Related U.S. Application Data

(63) Continuation of application No. PCT/JP2017/042989, filed on Nov. 30, 2017.
(Continued)

(51) Int. Cl.
*H04N 5/378* (2011.01)
*H01L 27/146* (2006.01)
(Continued)

(52) U.S. Cl.
CPC ...... *H01L 27/14605* (2013.01); *H01L 27/142* (2013.01); *H04N 5/2253* (2013.01);
(Continued)

(58) Field of Classification Search
USPC .......................................................... 348/148
See application file for complete search history.

(56) References Cited

U.S. PATENT DOCUMENTS 8,823,850 B2    9/2014   Rysinski et al.
2004/0223065 A1  11/2004  Takayanagi
(Continued)

FOREIGN PATENT DOCUMENTS

| EP | 0757476 A2 | 2/1997 |
|---|---|---|
| EP | 1 819 151 A1 | 8/2007 |
| JP | 2007-266556 A | 10/2007 |

OTHER PUBLICATIONS

Partial Supplementary European Search Report dated Sep. 19, 2019 issued in corresponding European Patent Application No. 17878149.8.
(Continued)

*Primary Examiner* — Behrooz M Senfi
(74) *Attorney, Agent, or Firm* — McDermott Will and Emery LLP

(57) ABSTRACT

A solid-state imaging apparatus includes a pixel array, a column processor, and a test signal generating circuit that generates a first digital signal for testing purposes. The test signal generating circuit generates the first digital signal within one horizontal scanning period. The column processor converts a first analog signal, that is converted from the first digital signal, to a second digital signal within the one horizontal scanning period.

16 Claims, 14 Drawing Sheets

Related U.S. Application Data

(60) Provisional application No. 62/431,603, filed on Dec. 8, 2016.

(51) Int. Cl.
| | |
|---|---|
| *H01L 27/142* | (2014.01) |
| *H04N 5/225* | (2006.01) |
| *H04N 5/232* | (2006.01) |
| *H04N 5/235* | (2006.01) |
| *H04N 5/363* | (2011.01) |
| *H04N 17/00* | (2006.01) |
| *H04N 5/355* | (2011.01) |
| *H04N 5/353* | (2011.01) |
| *B60R 11/04* | (2006.01) |
| *B60R 11/00* | (2006.01) |

(52) U.S. Cl.
CPC ......... *H04N 5/2254* (2013.01); *H04N 5/2353* (2013.01); *H04N 5/23229* (2013.01); *H04N 5/353* (2013.01); *H04N 5/355* (2013.01); *H04N 5/3559* (2013.01); *H04N 5/35554* (2013.01); *H04N 5/35563* (2013.01); *H04N 5/363* (2013.01); *H04N 5/378* (2013.01); *H04N 17/002* (2013.01); *B60R 11/04* (2013.01); *B60R 2011/0033* (2013.01)

(56) References Cited

U.S. PATENT DOCUMENTS

| | | | |
|---|---|---|---|
| 2007/0080838 A1* | 4/2007 | Asayama | H03M 1/66 |
| | | | 341/144 |
| 2010/0245647 A1* | 9/2010 | Honda | H01L 27/14634 |
| | | | 348/308 |
| 2016/0173796 A1* | 6/2016 | Takado | H04N 5/378 |
| | | | 348/302 |
| 2016/0255289 A1 | 9/2016 | Johnson et al. | |
| 2017/0104942 A1 | 4/2017 | Hirota et al. | |
| 2017/0155858 A1 | 6/2017 | Mabuchi | |
| 2019/0288020 A1* | 9/2019 | Ikuma | H04N 5/353 |

OTHER PUBLICATIONS

Extended European Search Report dated Dec. 2, 2019 issued in corresponding European Patent Application No. 17878149.8.

International Search Report and Written Opinion dated Feb. 20, 2018 in International Application No. PCT/JP2017/042988; with partial English translation.

International Search Report and Written Opinion dated Jan. 23, 2018 in International Application No. PCT/JP2017/042989; with partial English translation.

Non-Final Office Action issued in U.S. Appl. No. 16/431,277, dated Apr. 3, 2020.

\* cited by examiner

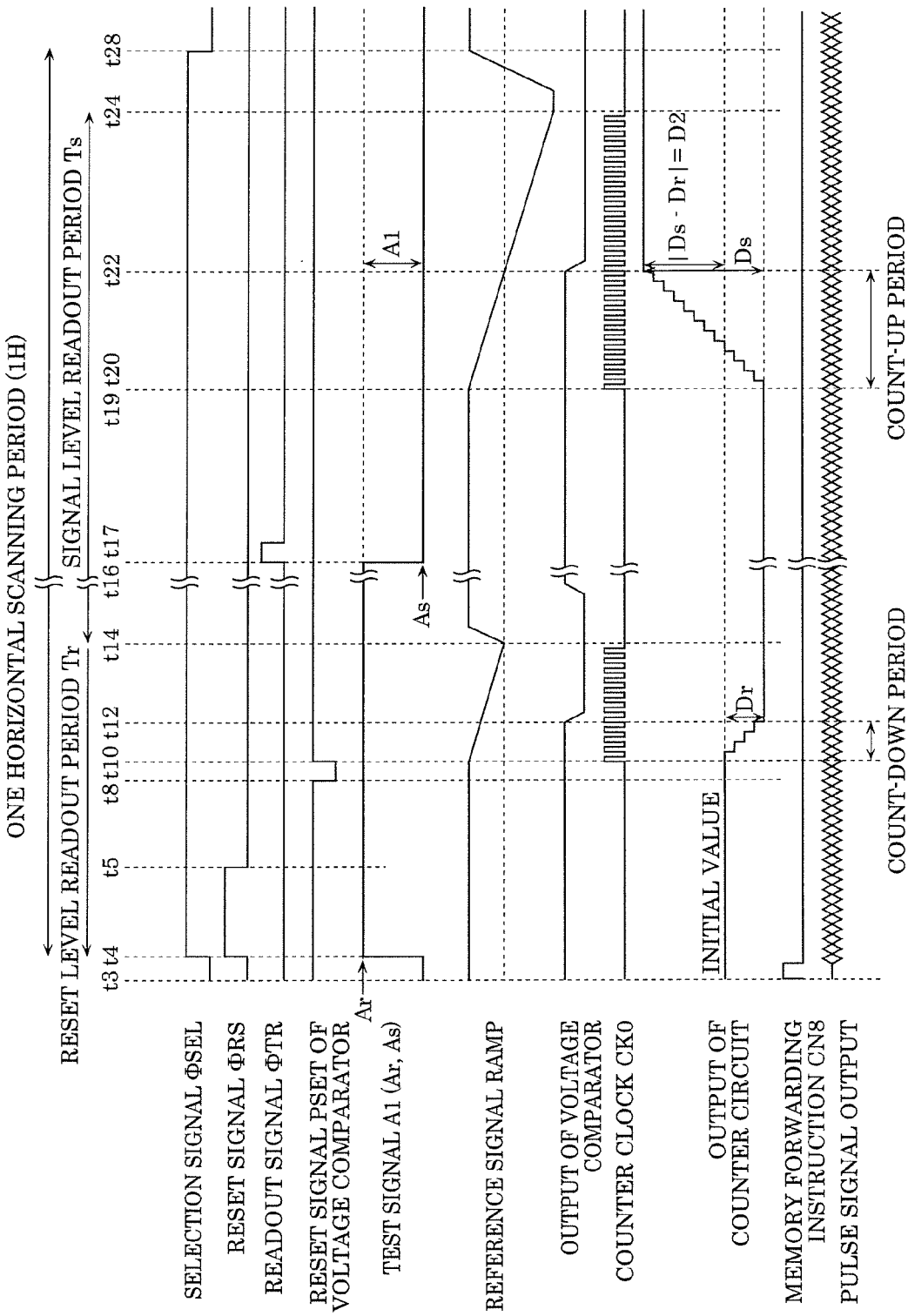

SOLID-STATE IMAGING APPARATUS AND IMAGING APPARATUS

CROSS REFERENCE TO RELATED APPLICATIONS

This application is a U.S. continuation application of PCT International Patent Application Number PCT/JP2017/042989 filed on Nov. 30, 2017, claiming the benefit of priority of U.S. Provisional Patent Application No. 62/431,603 filed on Dec. 8, 2016, the entire contents of which are hereby incorporated by reference.

BACKGROUND

1. Technical Field

The present disclosure relates to a solid-state imaging apparatus and an imaging apparatus.

2. Description of the Related Art

For conventional solid-state imaging apparatuses, a method for realizing a pixel array and a test circuit of an analog-to-digital converter (ADC) as shown in, for example, U.S. Pat. No. 8,823,850 has been proposed.

In the method in U.S. Pat. No. 8,823,850, a signal generated by a test pixel is input to the ADC of every column and an ADC test is performed during a test mode.

This U.S. Pat. No. 8,823,850 makes it possible to separately use the test mode and a normal mode, and perform tests during the test mode, but tests cannot be performed during the normal mode, i.e. during actual imaging.

In recent years, the ADC of solid-state imaging apparatuses have gotten a higher bit rate and have become faster. For example, they come with ADCs having a resolution of at least 12 bit and an analog-to-digital (A/D) conversion frequency of several hundreds of MHz. In order to perform such ADC tests, it is necessary that high-precision analog data is input at high speed and to perform tests handling high-bit digital signal output from the solid-state imaging apparatus at high speed.

It is, however, exceedingly difficult to input such a high-precision signal from an external device, output such a digital signal at high speed to an external device, and to synchronize a determination test to an imaging operation during imaging.

The present disclosure provides a solid-state imaging apparatus and an imaging apparatus that perform tests during the imaging.

SUMMARY

In order to solve the above problem, a solid-state imaging apparatus in the present disclosure includes a pixel array including a plurality of pixel circuits arranged in a matrix; a column processor including a column analog-to-digital converter (ADC) disposed for each column of the plurality of pixel circuits to convert an analog pixel signal to a digital pixel signal; and a test signal generating circuit that generates a first digital signal for testing purposes. The test signal generating circuit generates the first digital signal within one horizontal scanning period. The column processor converts a first analog signal, that is converted from the first digital signal, to a second digital signal within the one horizontal scanning period.

The solid-state imaging apparatus and the imaging apparatus in the present disclosure make it possible to perform tests during imaging.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3B is a timing diagram showing a readout operation of a test pixel signal of the pixel circuit in Embodiment 1;

DETAILED DESCRIPTION OF THE EMBODIMENTS

Hereinafter, a solid-state imaging apparatus according to embodiments in the present disclosure will be described with reference to the drawings.

However, unnecessarily detailed descriptions may be omitted.

For example, detailed descriptions of well-known matters or descriptions of components that are substantially the same as components described previous thereto may be omitted. This is to avoid redundancy and facilitate understanding of the descriptions for those skilled in the art. Note that the accompanying drawings and subsequent descriptions are provided to facilitate sufficient understanding of the present disclosure by those skilled in the art, and are thus not intended to limit the scope of the subject matter recited in the claims. In other words, the subsequent embodiments show a specific example in the present disclosure, and numerical values, shapes, components, placement and connection of the components, order of processes, and the like are mere examples and are not intended to limit the present disclosure.

Embodiment 1

Configuration Example of Solid-State Imaging Apparatus

Figure 1:
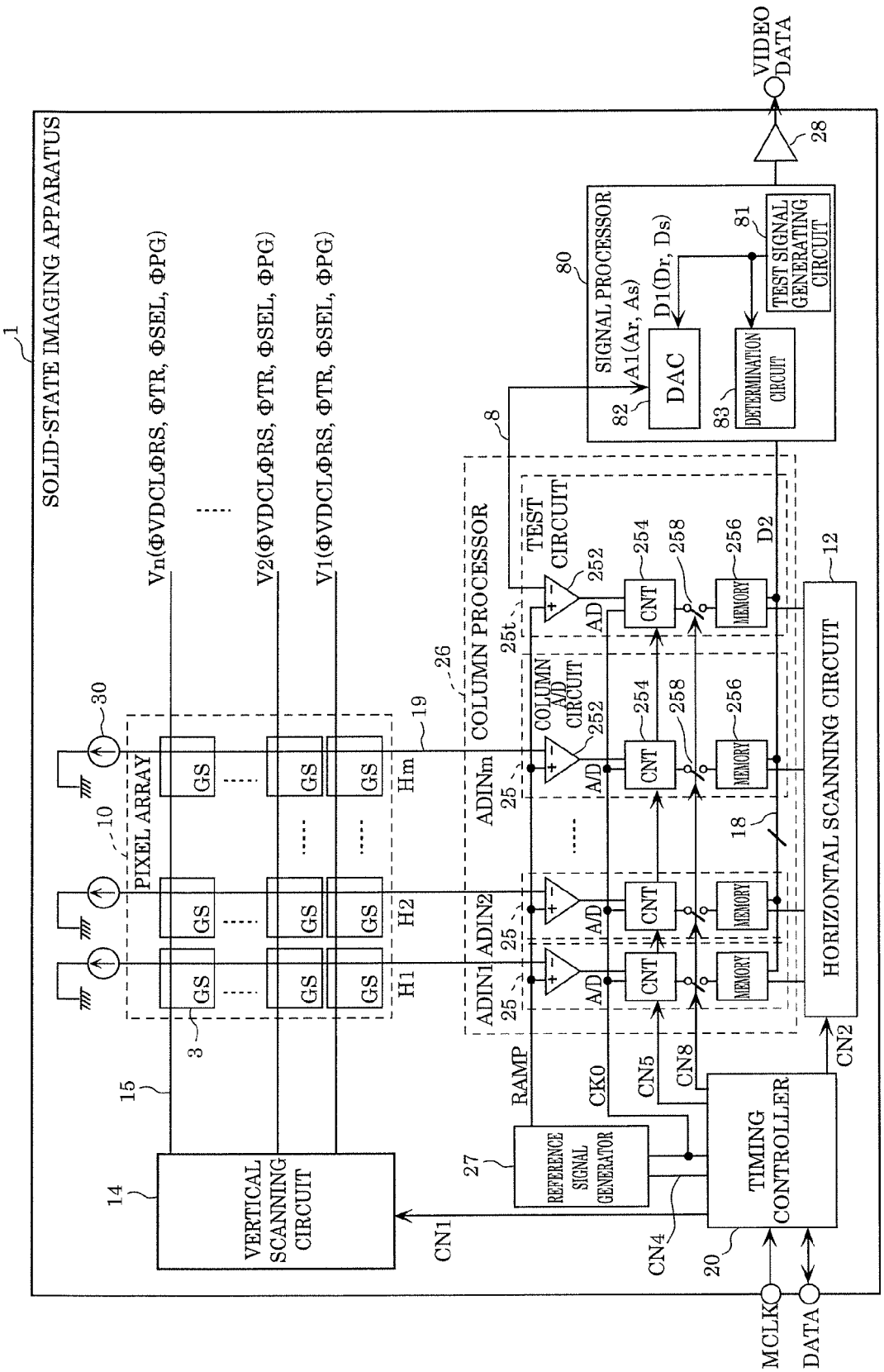
FIG. 1 is a block diagram showing a configuration example of a solid-state imaging apparatus in Embodiment 1.

FIG. 1 is a block diagram showing a configuration example of solid-state imaging apparatus 1 according to Embodiment 1.

Solid-state imaging apparatus 1 shown in the drawing includes pixel array 10, horizontal scanning circuit 12, vertical scanning circuit 14, vertical signal lines 19, timing controller 20, column processor 26, reference signal generator 27, output circuit 28, and signal processor 80. Solid-state imaging apparatus 1 further includes a master clock (MCLK) terminal that exteriorly receives a master clock input signal, a DATA terminal for exteriorly transceiving a command or data, a D1 terminal for exteriorly transmitting video data, and the like, and also includes various types of terminals to which a power-supply voltage and a ground voltage are supplied.

Pixel array 10 includes pixel circuits 3 arranged in a matrix. Pixel circuits 3 are arranged in n rows and m columns in FIG. 1.

A configuration example and operation of pixel circuit 3 will be described.

Figure 2A:
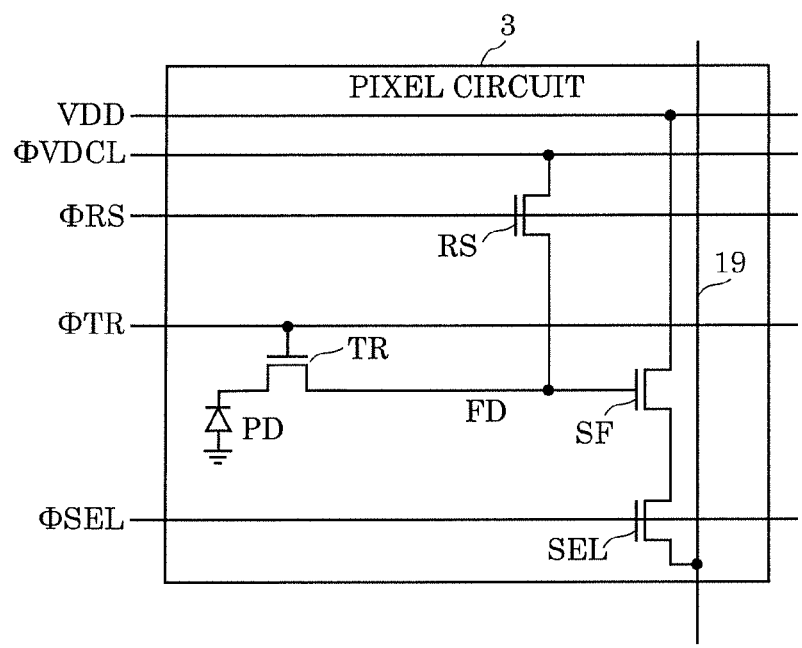
FIG. 2A is a diagram showing a circuitry example of a pixel circuit in Embodiment 1.
Figure 2B:
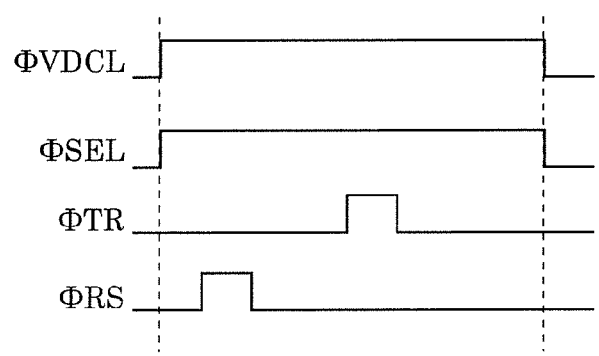
FIG. 2B is a timing diagram showing a readout operation of the pixel circuit in Embodiment 1.

FIG. 2A is a diagram showing a circuitry example of pixel circuit 3 according to Embodiment 1. FIG. 2B is a timing diagram showing a readout operation of pixel circuit 3 in Embodiment 1;

Pixel circuit 3 in FIG. 2A includes photodiode PD, floating diffusion layer FD, readout transistor TR, reset transistor RS, amplification transistor SF, and selection transistor SEL.

Photodiode PD is a light-receiving element that performs a photoelectric conversion, and generates an electric charge depending on the amount of light received.

Floating diffusion layer FD temporarily retains the electric charge read out by readout transistor TR from photodiode PD.

Readout transistor TR reads out (i.e. forwards) the electric charge from photodiode PD to floating diffusion layer FD in accordance with a readout control signal of readout control line ΦTR.

Reset transistor RS resets the electric charge of floating diffusion layer FD in accordance with a reset control signal of reset control line ΦRS. With this, a power-supply voltage of floating diffusion layer FD is reset. A source of reset transistor RS is connected to floating diffusion layer FD, a drain of reset transistor RS is connected to reset power-supply line ΦVDCL, and a gate of reset transistor RS is connected to reset control line ΦRS. Reset power-supply line ΦVDCL may have a fixed power-supply voltage, but may also have a power-supply voltage only during selection, and a ground level or low level not during selection. An exposure period is from a positive pulse of reset control line ΦRS to a positive pulse of readout control line ΦTR in FIG. 2B.

Amplification transistor SF outputs a voltage of floating diffusion layer FD to vertical signal lines 19 via selection transistor SEL as the analog pixel signal. The analog pixel signal includes (i) a reset level output from amplification transistor SF to vertical signal lines 19 immediately after a reset by reset transistor RS, and (ii) a signal level output from amplification transistor SF to vertical signal lines 19 immediately after a readout by readout transistor TR.

Selection transistor SEL selects whether to output the pixel signal of amplification transistor SF to vertical signal lines 19 in accordance with a selection control signal of selection control line ΦSEL.

Note that in FIG. 2A, an example of a pixel circuit with a so-called one pixel per cell structure is shown, but pixel circuit 3 may also have a so-called multiple pixels per cell structure. One unit cell of the multiple pixels per cell structure may include, for example, a plurality of photoelectric conversion elements, and have a structure in which any one of or all of floating diffusion layer FD, reset transistor RS, amplification transistor SF, and selection transistor SEL are shared within one unit cell.

Horizontal scanning circuit 12 in FIG. 1 outputs an analog-to-digitally (A/D) converted pixel signal by scanning each memory 256 in column processor 26 one by one. This scanning may be performed in the same order as column A/D circuits are arranged.

Vertical scanning circuit 14 scans horizontal scan line group 15 (also referred to as row control line group) disposed per row of pixel circuits 3 in pixel array 10 in row units. With this, vertical scanning circuit 14 selects pixel circuits 3 per row unit and causes the pixel signal from pixel circuits 3 belonging to the selected row to be simultaneously output to m vertical signal lines 19. The same number of horizontal scan line groups 15 are disposed as there are rows of the pixel circuits. In FIG. 1, n horizontal scan line groups 15 are disposed (in FIG. 1, V1, V2, . . . , Vn). Each horizontal scan line group 15 includes reset control line ΦRS, readout control line ΦTR, selection control line ΦSEL, and reset power-supply line ΦVDCL.

Vertical signal line 19 is disposed per column of pixel circuits 3 in pixel array 10 and propagates the pixel signal from pixel circuits 3 belonging to the selected row to column A/D circuits 25. Vertical signal lines 19 include m vertical signal lines H1 to Hm. Analog-to-digital converter (ADC) input lines include m ADC input lines ADIN1 to ADINm.

Timing controller 20 controls the entirety of solid-state imaging apparatus 1 by generating various control signal groups. The various control signal groups include control signal groups CN1, CN2, CN4, CN5, CN8, and counter clock signal CK0. For example, timing controller 20 receives master clock MCLK via a terminal; generates various internal clocks; and controls the horizontal scanning circuit, the vertical scanning circuit, and the like.

Column processor 26 includes column A/D circuit 25 per column, and test circuit 25t. Column A/D circuits 25 each A/D convert the pixel signal from vertical signal lines 19. More specifically, column A/D circuit 25 digitalizes the reset level and the signal level of the analog pixel signal, and performs a correlated double sampling (CDS) on a difference between the digitalized reset level and the digitalized signal level as the digital pixel signal.

Column A/D circuits 25 each include voltage comparator 252, counter 254, and memory 256.

Voltage comparator 252 (i) compares the analog pixel signal from vertical signal lines 19 with reference signal RAMP that is generated by reference signal generator 27 and includes a ramp waveform (i.e., triangular wave), and, for example, (ii) inverts the output signal indicating the comparison result when the former is greater than the latter. The comparison is performed with respect to both the reset level and the signal level of the analog pixel signal.

Counter 254 counts the time from when the triangular waves in reference signal RAMP start to change to when the output signal of voltage comparator 252 is inverted. Since the time up to the inverting is determined in accordance with the value of the analog pixel signal, a count value is digitalized pixel signal.

Memory 256 retains the count value of counter 254, i.e., the digital pixel signal.

Test circuit 25t has the same internal configuration as column A/D circuit 25, but is connected to test signal line 8 instead of vertical signal line 19. To be specific, test circuit 25t inputs the first analog signal from test signal line 8 for testing purposes instead of inputting the analog pixel signal from vertical signal line 19. The first analog signal is converted to a digital value by test circuit 25t, and is output to signal processor 80 as a second digital signal.

Reference signal generator 27 generates reference signal RAMP including triangular waves, and outputs reference signal RAMP to a plus input terminal of voltage comparator 252 in each of column A/D circuits 25.

Output circuit 28 outputs the digital pixel signal to video data terminal D1.

Signal processor 80 includes test signal generating circuit 81, digital-to-analog converter (DAC) 82, and determination circuit 83.

Test signal generating circuit 81 generates first digital test signal D1 for testing purposes. First digital test signal D1 includes first digital value (Dr) and second digital value (Ds) succeeding first digital value (Dr).

DAC 82 serves for functional safety. To be specific, DAC 82 converts the first digital signal, converted by test signal generating circuit 81, to first analog signal A1, and supplies the converted first analog signal A1 to pixel array 10 or column processor 26 as a substitute for the analog pixel signal. FIG. 1 shows an example of the first analog signal being supplied to test circuit 25t of column processor 26. The first analog signal includes first analog value (Ar) and second analog value (As) succeeding first analog value (Ar). First analog value (Ar) is a digital-to-analog (D/A) conversion result of first digital value (Dr). Second analog value (As) is a D/A conversion result of second digital value (Ds).

Determination circuit 83 determines whether a difference between the first digital signal and the second digital signal, which is converted from the first analog signal by column processor 26, is within an expected value range. To be specific, determination circuit 83 determines that (i) there is no problem when the difference between the first digital signal and the second digital signal is within the expected value range, and (ii) there is a problem when the difference is outside of the expected value range. The expected value is set at least 0 depending on a required performance.

Figure 3A:
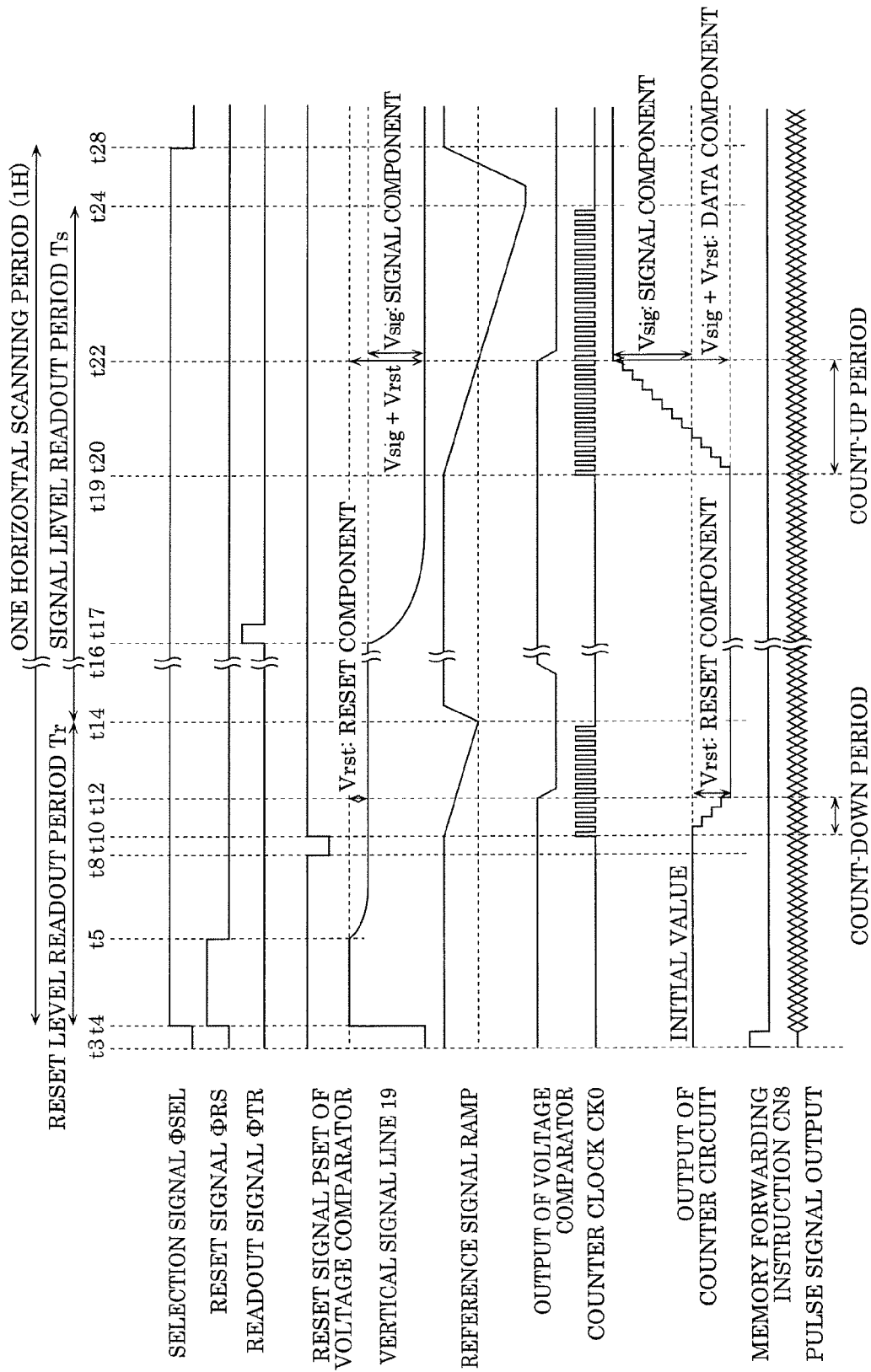
FIG. 3A is a timing diagram showing a readout operation of a normal pixel signal of the pixel circuit in Embodiment 1.

FIG. 3A is a timing diagram showing a readout operation of a normal pixel signal of solid-state imaging apparatus 1 according to the present embodiment.

Reference signal RAMP in each horizontal scanning period has triangular waves at a count-down period (t10 to t14) and an count-up period (t20 to t24) in FIG. 3A.

The count-down period (t10 to t12) is a period for A/D converting reset component Vrst of the analog pixel signal output from amplification transistor SF. The time from when the count-down period starts (when the triangular wave starts changing) up to when the output of voltage comparator 252 inverts is counted down by counter 254. This count value is an A/D conversion result of reset component Vrst of the analog pixel signal. Hereinafter, period t4 to t14 including the count-down period (t10 to t12) is referred to as reset level readout period Tr.

The count-up period (t20 to t22) is a period for A/D converting a level of a data component (signal component Vsig+reset component Vrst) of the analog pixel signal output from amplification transistor SF. The time from when the count-up period starts (when the triangular wave starts changing) up to when the output of voltage comparator 252 inverts is counted up by counter 254. This count-up converts the data component (Vsig+Vrst) of the analog pixel signal to a digital value. Since this count-up sets a count-down value indicating reset component Vrst as an initial value, a count value when the count-up period has finished represents a result of the CDS which subtracts the reset component from the data component. In other words, the count value when the count-up period has finished is a digital value representing signal component Vsig. Hereinafter, period t14 to t24 including the count-up period (t20 to t22) is referred to as signal level readout period Ts.

In this manner, column A/D circuits 25 eliminate any variations in each of the columns, e.g. clock skew or counter delay, leading to measurement errors, and extract only the proper signal component Vsig, i.e., perform a digital CDS.

a one-frame image can be obtained by sequentially and cyclically performing the horizontal scanning period for n rows.

FIG. 3B is a timing diagram showing a readout operation of a test pixel signal of pixel circuit 3 in Embodiment 1. This operation is performed within one horizontal scanning period included in the vertical blanking interval during imaging by solid-state imaging apparatus 1. In other words, FIG. 3A shows the readout operation of a horizontal scanning period besides the vertical blanking interval, while FIG. 3B shows a test operation of a horizontal scanning period within the vertical blanking interval. FIG. 3B mainly differs from FIG. 3A in that test signal A1 (Ar, As) is shown instead of vertical signal line 19. Hereinafter, differences with FIG. 3A will be mainly described without repeating overlapping descriptions.

The test signal indicates first analog signal A1 supplied from DAC 82 to test circuit 25t as a substitute for the analog pixel signal. First analog signal A1 is the D/A converted first digital test signal D1 generated by test signal generating circuit 81. First analog value Ar and second analog value As included in first analog signal A1 correspond respectively to first digital value Dr and second digital value Ds included in first digital value D1.

Voltage comparator 252 in test circuit 25t compares a first ramp waveform of reference signal RAMP to first analog value Ar during reset level readout period Tr, and a second ramp waveform of reference signal RAMP to second analog value As during signal level readout period Ts.

Counter 254 outputs, as second digital signal D2, a difference between (i) a first count value indicating a time from when a first ramp waveform during reset level readout operation Tr starts to change to when a determination result of voltage comparator 252 is inverted, and (ii) a second count value indicating a time from when a second ramp waveform during signal level readout operation Ts starts to change to when a determination result of voltage comparator 252 is inverted. Second digital signal D2 corresponds to a difference between first digital value Dr and second digital value Ds of first digital test signal D1, and corresponds to a difference between first analog value Ar and second analog value As of first analog signal A1. When there is no problem in solid-state imaging apparatus 1, the second digital value coincides with the difference between first digital value Dr and second digital value Ds, or is contained within an error range.

This enables solid-state imaging apparatus 1 in FIG. 1 to perform loop-back tests during the imaging using test signal generating circuit 81, DAC 82, determination circuit 83, and test circuit 25t. Test circuit 25t has the same configuration as column A/D circuit 25, and tests a linearity fault detection of the A/D conversion and the like for column A/D circuit 25.

A specific example of the test signal will be described next.

Figure 4:
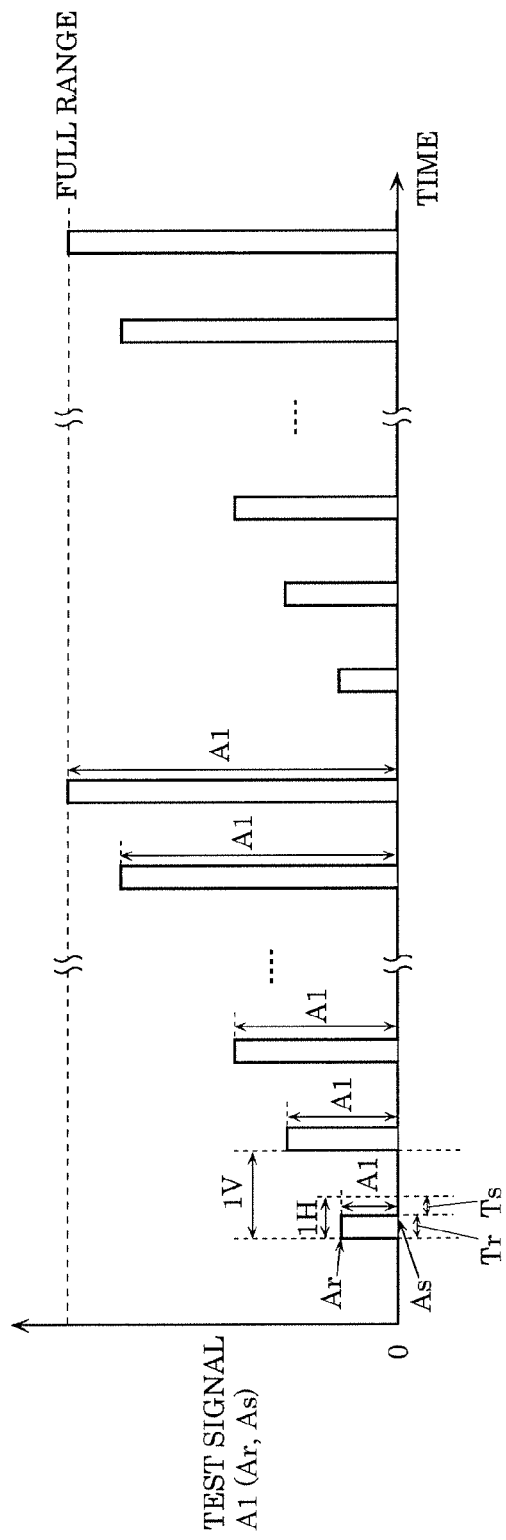
FIG. 4 is a diagram showing an example of a first analog signal as a test signal updated with every vertical scanning period.
Figure 5:
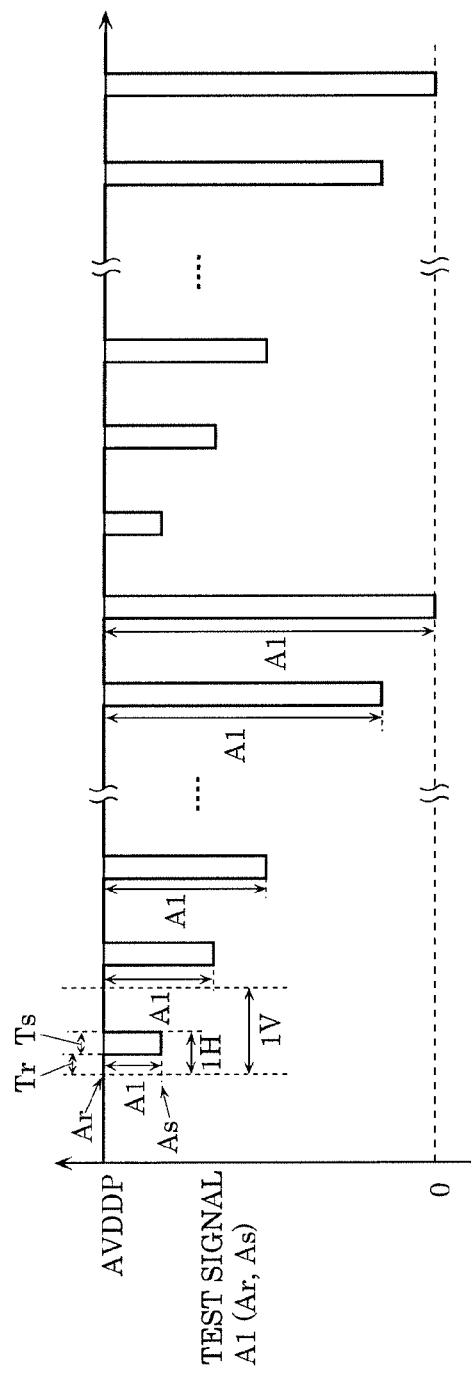
FIG. 5 is a diagram showing another example of the first analog signal as the test signal updated with every vertical scanning period.

FIG. 4 is a diagram showing an example of first analog signal A1 as the test signal updated with every vertical scanning period. FIG. 5 is a diagram showing another example of first analog signal A1 as the test signal updated with every vertical scanning period.

The horizontal axes in FIGS. 4 and 5 indicate time. 1V in the drawing indicates one vertical scanning period. 1H in the drawing indicates one horizontal scanning period in the vertical blanking interval. The vertical axes indicate first analog value Ar and second analog value As included in the first analog signal. First analog value Ar and second analog value As are respectively the D/A converted first digital value D1 and second digital value D2 generated by test signal generating circuit 81.

Test signal generating circuit 81, for example, increases or decreases first digital signal D1 to for each vertical blanking interval during imaging or each horizontal scanning period in the vertical blanking interval during the imaging.

In the example of FIG. 4, test signal generating circuit 81 increases first digital value Dr by a predetermined degree for each vertical blanking interval during the imaging, and sets second digital value Ds at a fixed value of 0. The predetermined degree may, for example, be larger than a minimum degree of a DAC circuit that generates the reference signal in reference signal generator 27. Test signal generating circuit 81 sequentially and cyclically increases the first digital signal from a minimum value to a maximum value or sequentially and cyclically decreases the first digital signal from a maximum value to a minimum value. Test signal generating circuit 81 sequentially and cyclically increases first digital value Dr from a minimum value (e.g. 0) to a maximum value (e.g. values corresponding to a full range) over a plurality of vertical operation periods.

In the example of FIG. 5, test signal generating circuit 81 generates first digital value Dr as a fixed value every vertical blanking interval during the imaging, and decreases second digital value Ds by the predetermined degree. The fixed first digital value Dr, may, for example, correspond to power-supply voltage AVDDP that is the reset level of the analog pixel signal. Test signal generating circuit 81 sequentially and cyclically decreases second digital value Ds from a maximum value (e.g. value corresponding to power-supply voltage AVDDP) to a minimum value (e.g. 0) over the plurality of vertical operation periods.

This makes it possible to perform an A/D conversion linearity test with high precision in column processor 26.

Solid-state imaging apparatus 1 in the above-described Embodiment 1 includes pixel array 10 including pixel circuits 3 arranged in a matrix; column processor 26 including column A/D circuit 25 disposed for each column of pixel circuits 3 to convert an analog pixel signal to a digital pixel signal; test signal generating circuit 81 that generates first digital signal D1 for testing purposes; DAC 82 that converts the first digital signal to first analog signal A1 and supplies first analog signal A1 to pixel array 10 or column processor 26 as a substitute for the analog pixel signal; and determination circuit 83 that determines whether a difference between first digital signal D1 and second digital signal D2 converted from first analog signal A1 by the column processor is within an expected value range. Test signal generating circuit 81 generates first digital signal D1 within one horizontal scanning period included in the vertical blanking interval during the imaging. Column processor 26 converts first analog signal A1 to second digital signal D2 within the one horizontal scanning period included in the vertical blanking interval during the imaging.

This makes it possible to perform tests during the imaging. In other words, it is no longer necessary to implement a test mode in which tests are performed outside of the imaging.

Column processor 26 may further include test circuit 25t having the same internal configuration as the column ADC. First analog signal A1 may be supplied to test circuit 25t as a substitute for the analog pixel signal.

This enables the test circuit to, for example, perform the linearity fault detection of the A/D conversion for the column ADC.

Solid-state imaging apparatus 1 may include reference signal generator 27 that generates a reference signal having a ramp waveform that changes over time. Column A/D circuit 25 may include voltage comparator 252 that compares the reference signal to the analog pixel signal, and counter 254 that outputs a count value in accordance with a time from when the ramp waveform starts to change to when the determination result of the voltage comparator is inverted as the digital pixel signal. DAC 82 may link with reference signal generator 27 and adjust an output gain of first analog signal A1 so that first analog signal A1 does not increase beyond the amplitude of the ramp waveform.

Test signal generating circuit 81 may increase or decrease first digital signal D1 for each vertical blanking interval during the imaging or each horizontal scanning period in the vertical blanking interval during the imaging.

Test signal generating circuit 81 sequentially and cyclically increases first digital test signal D1 from a minimum value to a maximum value, or sequentially and cyclically decreases first digital test signal D1 from a maximum value to a minimum value. A predetermined range may correspond to an input range of column A/D circuit 25.

The analog pixel signal includes the reset level and the signal level. Column A/D circuit 25 digitalizes both the reset level and the signal level of the analog pixel signal, and performs the CDS on the difference between the digitalized reset level and the digitalized signal level as the pixel signal. Test signal generating circuit 81 generates first digital signal D1 including first digital value Dr and second digital value Ds. The horizontal scanning period includes reset level readout period Tr and signal readout period Ts. Test signal generating circuit 81 may generate (i) first digital value Dr during reset level readout period Tr in one horizontal scanning period included in the vertical blanking interval, and (ii) second digital value Ds during signal level readout period Ts in one horizontal scanning period included in the vertical blanking interval.

Test signal generating circuit 81 may generate first digital value Dr as a fixed value corresponding to the power-supply voltage, and may increase or decrease second digital value Ds for each vertical blanking interval during the imaging or each horizontal scanning period in the vertical blanking interval during the imaging.

Test signal generating circuit 81 may increases or decreases first digital value Dr for each vertical blanking interval during the imaging or each horizontal scanning period in the vertical blanking interval during the imaging, and may generate second digital value Ds as a fixed value indicating a ground level.

DAC 82 (i) may convert first digital value Dr to first analog value Ar and supply first analog value Ar to pixel array 10 or column processor 26 as a substitute for the reset level of the analog pixel signal, (ii) and may convert second digital value Ds to second analog value As and supply second analog value As to pixel array 10 or column processor 26 as a substitute for the signal level of the analog pixel signal. Solid-state imaging apparatus 1 may include reference signal generator 27 that generates a reference signal having a first ramp waveform that changes over time during reset level readout period Tr and a second ramp waveform that changes over time during signal level readout period Ts. Column A/D circuit 25 may include voltage comparator 252 that compares the second ramp waveform to second analog value As during signal level readout period Ts, and counter 254 that outputs a difference between a first count value that indicates a time from when the first ramp waveform starts to change to when the determination result of voltage comparator 252 is inverted and a second count value that indicates a time from when the second ramp waveform starts to change to when the determination result of voltage comparator 252 is inverted as the digital pixel signal.

Determination circuit 83 may determine that (i) there is no problem when the difference between first digital signal D1 and second digital signal D2 is within the expected value range, and (ii) there is a problem when the difference is outside of the expected value range.

Test signal generating circuit 81 may increase or decrease at least one of first digital value Dr and second digital value Ds for each vertical blanking interval during the imaging or each horizontal scanning period in the vertical blanking interval during the imaging. The output gain of DAC 82 may be adjusted so that first analog value Ar does not exceed beyond the amplitude of the first ramp waveform and second analog value As does not exceed beyond the amplitude of the second ramp waveform.

Reference signal generator 27 may include a DAC circuit that generates the reference signal. Test signal generating circuit 81 may increase or decrease first digital test signal D1 by a predetermined degree for each vertical blanking interval during the imaging or each horizontal scanning period in the vertical blanking interval during the imaging. The predetermined degree may be higher than a minimum degree in the DAC circuit.

Test region 101 may include pixel circuit 3 for testing purposes corresponding to N rows farthest away from column processor 26. Test signal generating circuit 81 may increase or decrease first digital signal N times in N horizontal scanning periods in the vertical blanking interval during the imaging.

Note that a gain signal from when the reference signal is generated in reference signal generator 27 and a gain signal of DAC 82 may be linked, and a maximum amplitude of DAC 82 may be adjusted.

The maximum amplitude of DAC 82 and the reference signal of reference signal generator 27 may be aligned so that tests can be performed with the first analog signal corresponding to a maximum amplitude of the analog pixel signal during the imaging. Note that when the gain of DAC 82 is determined beforehand, the gains do not need to be linked.

When a fault tolerant time interval (FTTI) is set up for the functional safety, a D/A resolution and range of DAC 82 may be determined so that its value is satisfied.

Embodiment 2

Solid-state imaging apparatus 1 in Embodiment 2 will be described next.

A configuration example without test circuit 25t and of first analog signal A1, which is the test signal, being supplied to column A/D circuits 25 is described in Embodiment 2.

Figure 6:
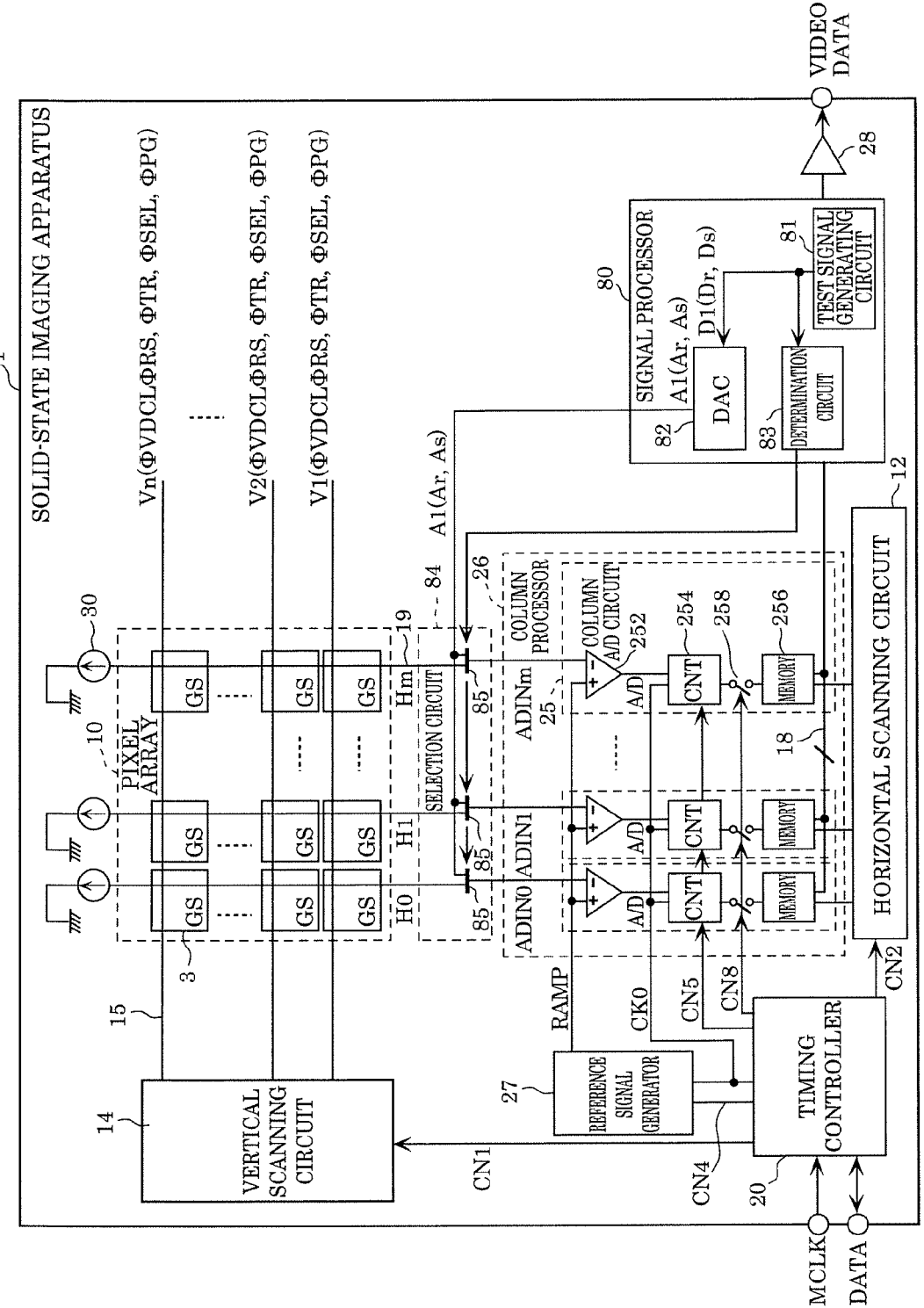
FIG. 6 is a block diagram showing a configuration example of the solid-state imaging apparatus in Embodiment 2.

FIG. 6 is a block diagram showing the configuration example of solid-state imaging apparatus 1 according to Embodiment 2. FIG. 6 differs from FIG. 1 in that test circuit 25t has been removed and selection circuit 84 has been added. Hereinafter, differences with FIG. 1 will be mainly described without repeating overlapping descriptions.

Selection circuit 84 includes selector 85 disposed at each row of pixel circuits 3.

Each selector 85 selects and outputs one of an analog signal from vertical signal lines 19 and first analog signal A1 from DAC 82 to a corresponding column A/D circuit 25. The selection of selector 85 is dependent on the selection control signal from signal processor 80. Each selector 85, for example, selects first analog signal A1 from DAC 82 during at least one horizontal scanning period included in the vertical blanking interval in the vertical scanning period during the imaging, and selects the analog pixel signal from vertical signal lines 19 during the other horizontal scanning periods in the vertical blanking interval in the vertical scanning period during the imaging.

This configuration makes it possible to supply first analog signal A1 to column A/D circuit 25 in each column as the test signal output from DAC 82. It is therefore possible to perform the linearity fault detection of the A/D conversion and the like in column A/D circuit 25 in all of the columns.

Solid-state imaging apparatus 1 in the above-described Embodiment 2 further includes selector 85 disposed at each row of pixel circuits 3. Selector 85 selects and outputs one of the analog signal and first analog signal A1 to a corresponding column A/D circuit, selects first analog signal A1 one horizontal scanning period included in the vertical blanking interval during the imaging, and selects the analog pixel signal during the horizontal scanning period not included in the vertical blanking interval during the imaging.

This makes it possible to perform tests during the imaging. In other words, it is no longer necessary to implement a test mode in which tests are performed outside of the imaging. It is therefore possible to perform the linearity fault detection of the A/D conversion and the like in column A/D circuit 25 in all of the columns.

Embodiment 3

A configuration example in which first analog signal A1 as the test signal from DAC 82 is supplied to pixel array 10 as a substitute for the analog pixel signal is described in Embodiment 3.

Figure 7:
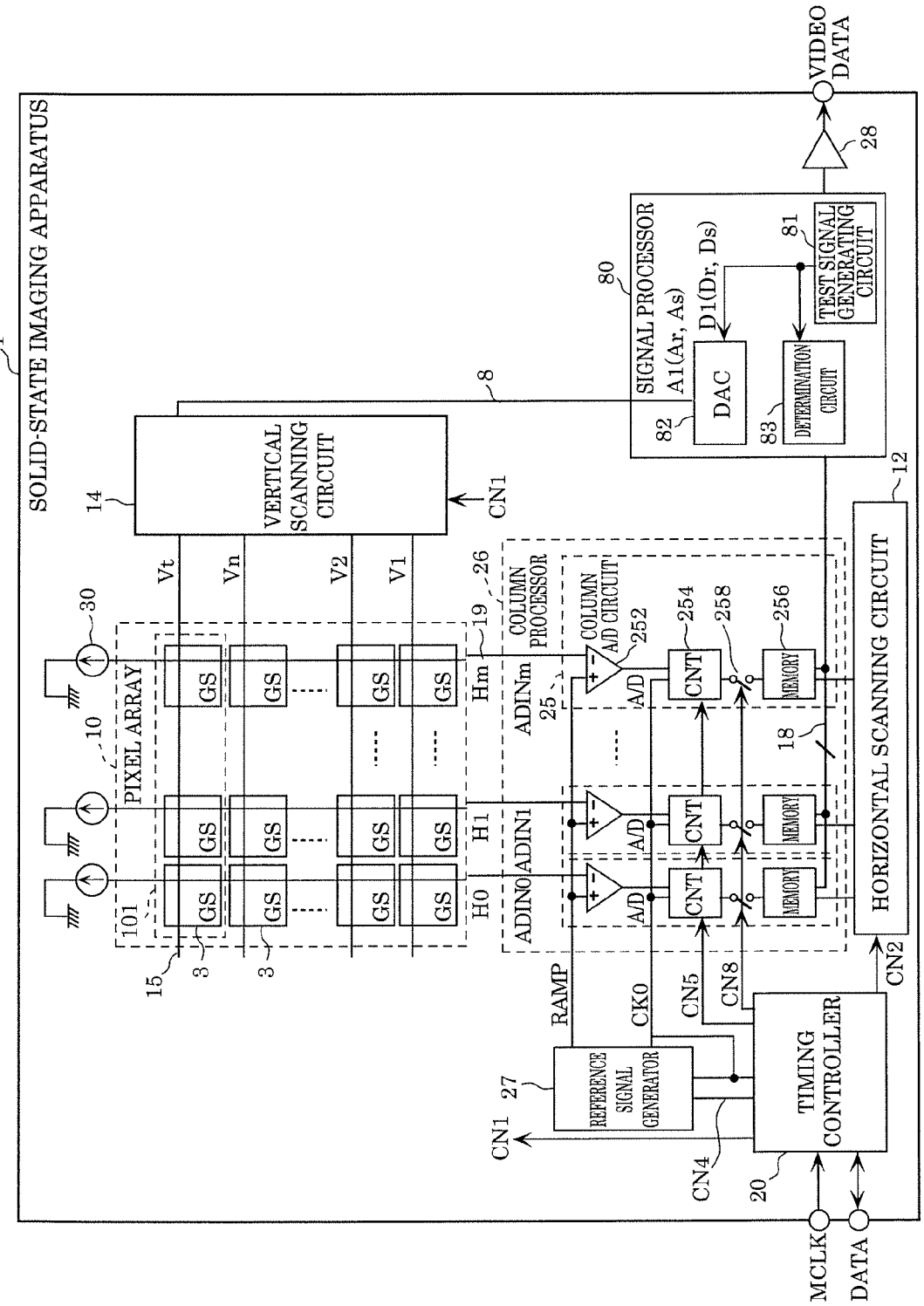
FIG. 7 is a block diagram showing a configuration example of the solid-state imaging apparatus in Embodiment 3.

FIG. 7 is a block diagram showing the configuration example of solid-state imaging apparatus 1 in Embodiment 3. FIG. 7 differs from FIG. 1 in that test circuit 25t has been removed, pixel array 10 has test region 101, and first analog signal A1, which is the test signal from DAC 82, is supplied to the test region via vertical scanning circuit 14. Hereinafter, the differences with FIG. 1 will mainly be described.

Pixel array 10 has test region 101 including at least one row of pixel circuits 3. Pixel circuits 3 in test region 101 have the same internal configuration as the other pixel circuits 3, and may also be the same as in FIG. 2A.

First analog signal A1, which is the test signal from DAC 82, is supplied to pixel circuits 3 in test region 101 via vertical scanning circuit 14. To be specific, first analog signal A1 is supplied to a drain of reset transistor RS in test region 101 during the one horizontal scanning period included in the vertical blanking interval during the imaging. With this, first analog signal A1 is supplied to floating diffusion layer FD and the gate of amplification transistor SF via reset transistor RS as the substitute for the analog pixel signal.

First analog signal A1 being supplied to test region 101 will be described in further detail.

Figure 8:
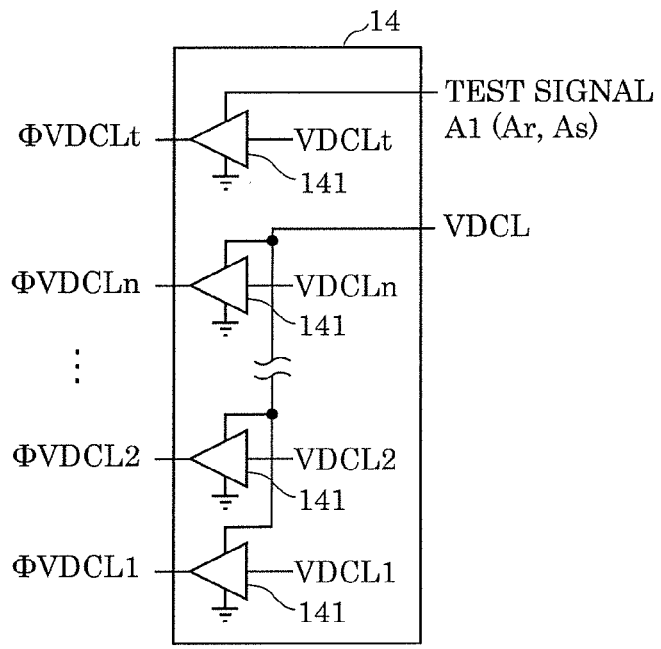
FIG. 8 is a circuit diagram showing a configuration example of a portion of a vertical scanning circuit in Embodiment 3.

FIG. 8 is a circuit diagram showing a configuration example of a portion of vertical scanning circuit 14 in Embodiment 3. FIG. 8 shows only a circuit of the internal configuration of vertical scanning circuit 14 that outputs reset power-supply line ΦVDCL, and any other components are omitted. Vertical scanning circuit 14 in FIG. 8 includes drivers 141 that output the power-supply signal to these reset power-supply lines ΦVDCL1 to ΦVDCLn and ΦVDCLt. Reset power-supply lines ΦVDCL1 to ΦVDCLn are respectively connected to the drain of reset transistor RS in a first row to an nth row of pixel circuits 3 in pixel array 10. Reset power-supply line ΦVDCLt is connected to the drain of reset transistor RS of pixel circuits 3 in test region 101. Driver 141 connected to reset power-supply line ΦVDCLt is supplied with first analog signal A1 as a power-supply voltage, and as a result, outputs first analog signal A1 to reset power-supply line ΦVDCLt.

Figure 9:
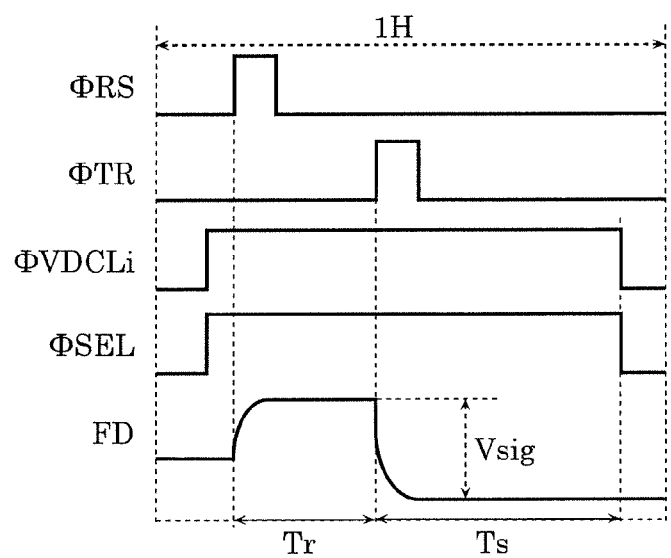
FIG. 9 is a timing diagram showing a readout operation of the normal pixel signal in Embodiment 3.

FIG. 9 is a timing diagram showing a readout operation of the normal pixel signal in Embodiment 3. Reset control line ΦRS, readout control signal ΦTR, selection control line ΦSEL are the same as in FIG. 3A. Reset power-supply line ΦVDCLi (i is any one of 1 to n) is driven with a signal similar to the selection control line, and sets the drain of reset transistor RS at a high level or power-supply voltage VDCL over the selected period.

Figure 10:
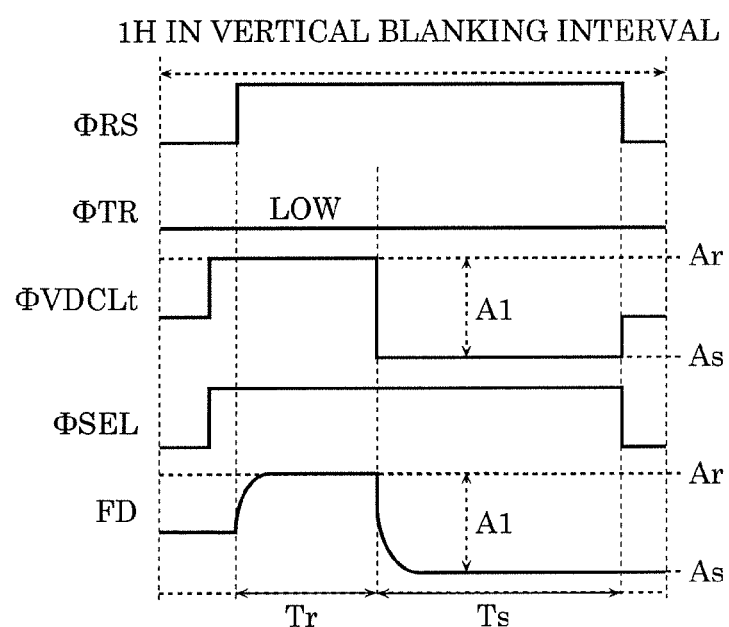
FIG. 10 is a timing diagram showing a readout operation of the test pixel signal in Embodiment 3.

In contrast, FIG. 10 is a timing diagram showing a readout operation of the test pixel signal in Embodiment 3. In other words, FIG. 10 shows a test operation in the vertical blanking interval during the imaging. FIG. 10 differs from FIG. 9 in that the signal of reset power-supply line ΦVDCLt is not at a fixed level during the period selected by selection control line ΦSEL, and is at the level of first analog value Ar and second analog value As of the first analog signal. Reset control line ΦRS is at a high level during the period selected by selection control line ΦSEL. In other words, reset transistor RS is on throughout the period selected by selection control line ΦSEL. As a result, first analog signal A1 is supplied to floating diffusion layer FD and the gate of amplification transistor SF. As illustrated in FIG. 10, floating diffusion layer FD has first analog value Ar during reset level readout period Tr and second analog value As during signal level readout period Ts. A difference between first analog value Ar and second analog value As is the value of first analog signal A1.

Figure 11:
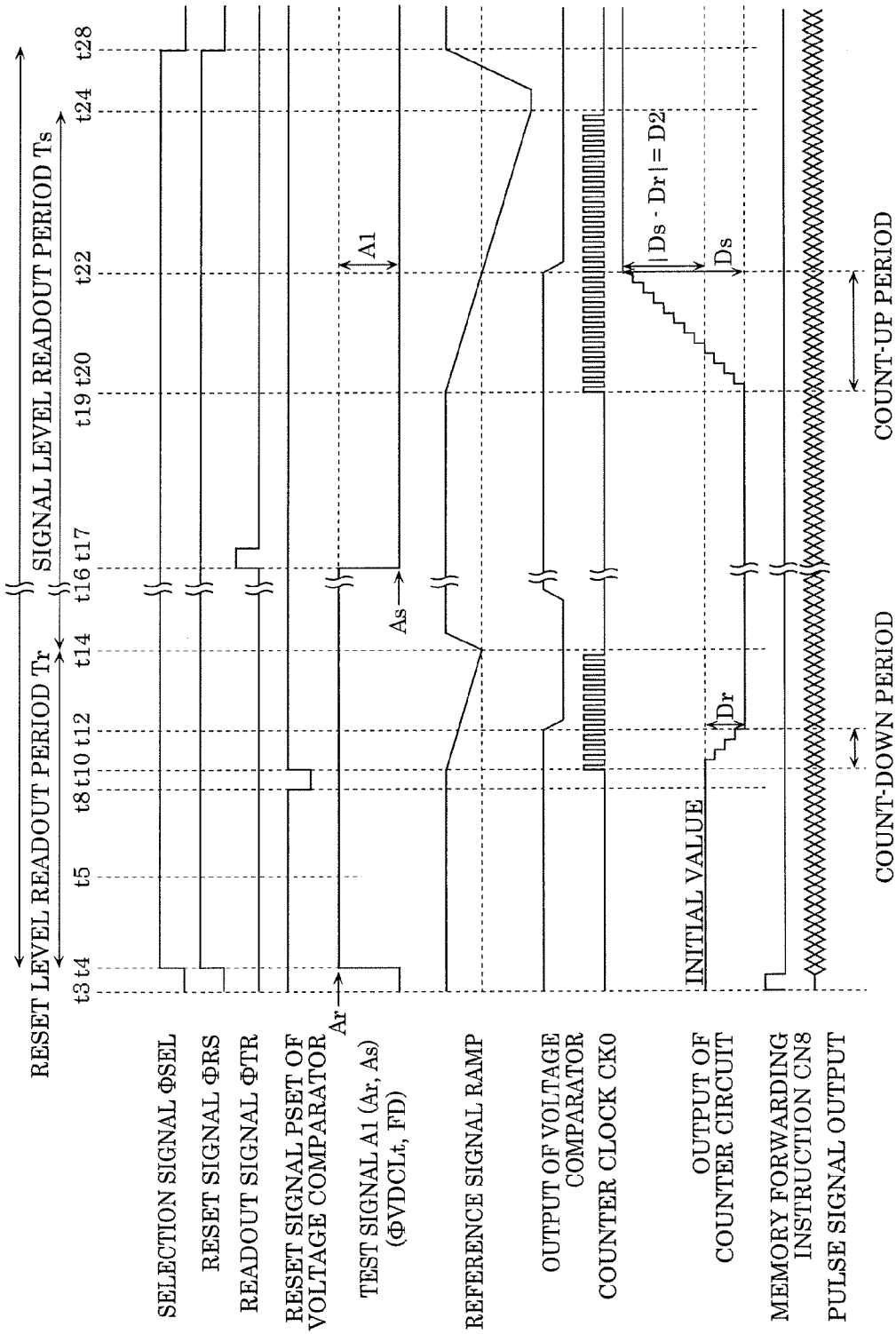
FIG. 11 is a timing diagram showing a readout operation of the test pixel signal in Embodiment 3.

FIG. 11 is a timing diagram showing a readout operation of the test pixel signal in Embodiment 3. FIG. 11 differs from FIG. 3B in that the test signal is supplied to reset signal ΦRS. Hereinafter, the differences with FIG. 3B will mainly be described.

Reset signal ΦRS is at a high level at the same time as selection signal ΦSEL as illustrated in FIG. 10. With this, reset transistor RS is on throughout the period selection by selection line ΦSEL.

First analog signal A1, which is the test signal, is supplied to floating diffusion layer FD via reset transistor RS. Similar to FIG. 10, floating diffusion layer FD has first analog value Ar during reset level readout period Tr and second analog value As during signal level readout period Ts.

In this manner, solid-state imaging apparatus 1 in Embodiment 3 supplies first analog signal A1, which is the test signal, to floating diffusion layer FD in pixel circuit 3. This makes it possible to perform not only a fault detection in column A/D circuits 25, but also perform a fault detection in the pixel circuits and a disconnection and short circuit detection in vertical signal lines 19.

Figure 12:
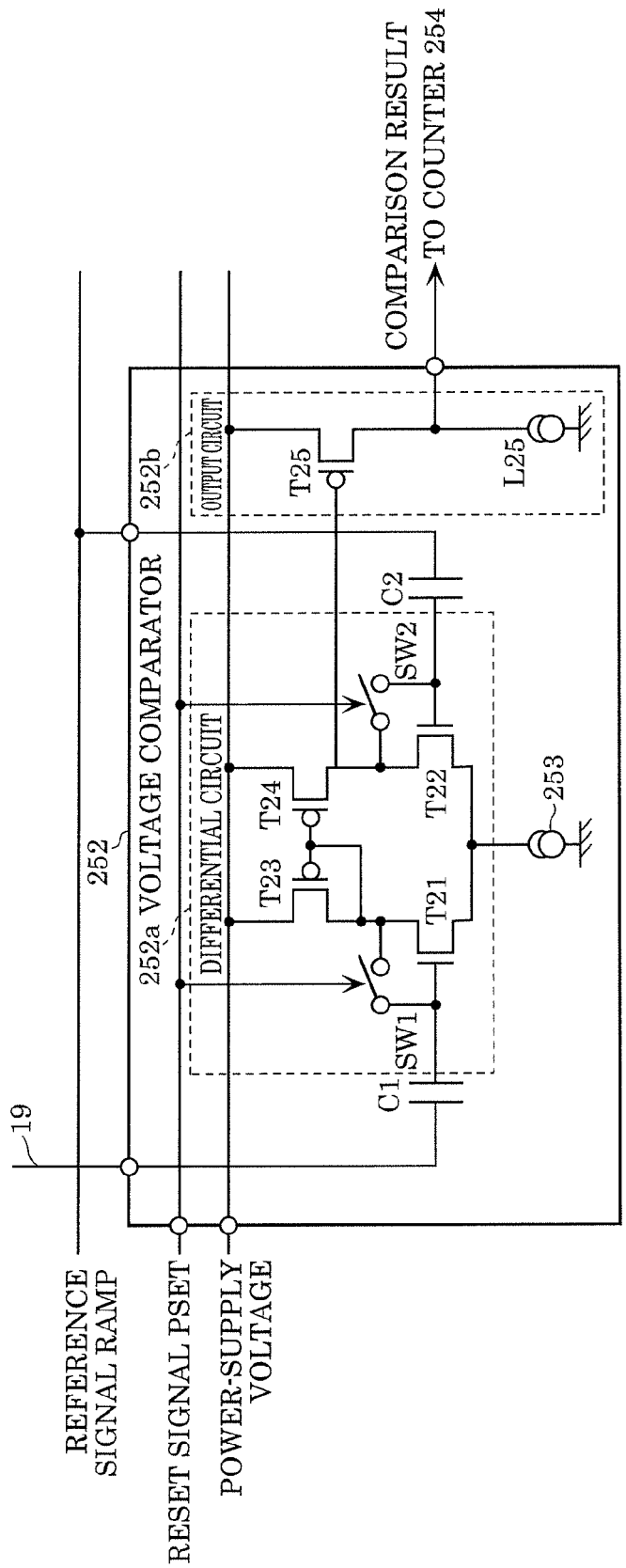
FIG. 12 is a circuit diagram showing a configuration example of a voltage comparator in Embodiment 3.

FIG. 12 is a circuit diagram showing a configuration example of voltage comparator 252 in Embodiment 3. Voltage comparator 252 in the drawing includes input capacitance elements C1 and C2, differential circuit 252a, output circuit 252b, and comparator current supply 253.

The analog pixel signal from vertical signal lines 19 is input to input capacitance element C1. Reference signal RAMP is input to input capacitance element C2.

Differential circuit 252a includes four transistors T21 to T24. The analog pixel signal from vertical signal lines 19 is input to a gate terminal of transistor T21 via input capacitance element C1. Reference signal RAMP is input to a gate terminal of transistor T22 via input capacitance element C2. Switches SW1 and SW2 are further disposed in differential circuit 252a for resetting input capacitance elements C1 and C2. Input capacitance elements C1 and C2 are reset with reset signal PSET in FIGS. 3A, 3B, and 11.

Comparator current supply 253 is connected to source terminals of transistors T21 and T22 of differential circuit 252a.

As described above, in solid-state imaging apparatus 1 in Embodiment 3, pixel array 10 has test region 101 including at least one row of pixel circuits 3. Pixel circuits 3 each include floating diffusion layer FD that retains signal charge corresponding to the analog pixel signal and reset transistor RS that sets a reset potential in floating diffusion layer FD, and amplification transistor SF that includes a gate connected to floating diffusion layer FD and outputs a potential of the gate to vertical signal lines 19. A source of reset transistor RS is connected to floating diffusion layer FD. First analog signal A1 is supplied to a drain of reset transistor RS in test region 101 during the one horizontal scanning period included in the vertical blanking interval during the imaging.

This makes it possible to perform not only a fault detection in column A/D circuit 25, but also perform a fault detection in the pixel circuits and a disconnection and short circuit detection in vertical signal lines 19 during the imaging.

The at least one row of pixel circuits 3 in test region 101 may include a row farthest away from column processor 26.

This makes it possible to more reliably perform the disconnection and short circuit detection in vertical signal lines 19.

Embodiment 4

A configuration example in which two pixel arrays 10 are disposed at both ends of the column in the test region in Embodiment 3 is described in Embodiment 4.

Figure 13:
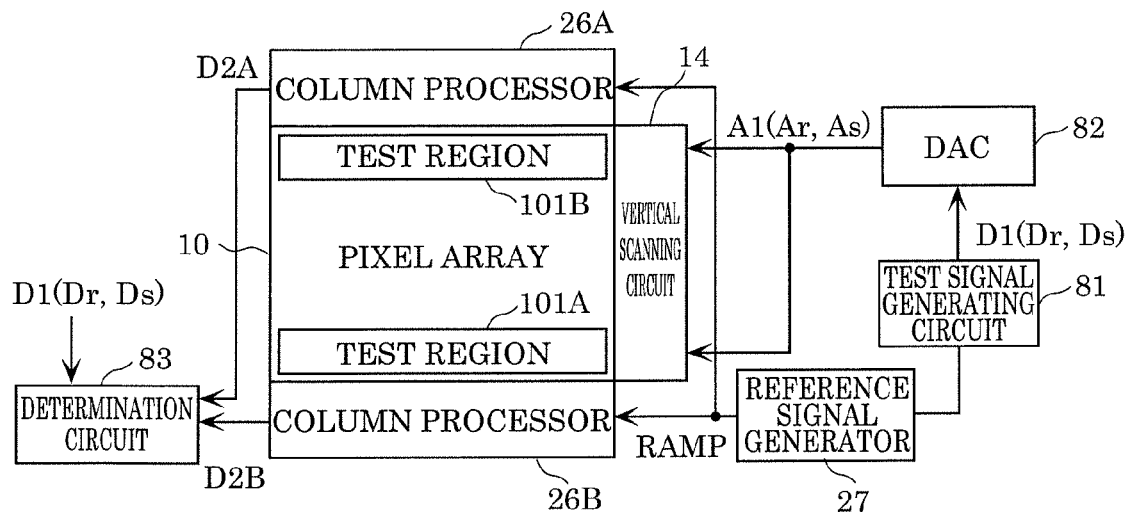
FIG. 13 is a block diagram showing a configuration example of the solid-state imaging apparatus in Embodiment 4.

FIG. 13 is a block diagram showing the configuration example of solid-state imaging apparatus 1 in Embodiment 4. FIG. 13 mainly differs from FIG. 7 in that solid-state imaging apparatus 1 includes column processors 26A and 26B instead of column processor 26 and test regions 101A and 101B instead of test region 101. Hereinafter, the differences with FIG. 7 will mainly be described.

Column processor 26A includes column A/D circuit 25 in half of the columns of pixel circuits 3. Half of the columns may, for example, a set of uneven columns, a set of two successive columns and two columns skipped, a set of four successive columns and four columns skipped, half of the columns at one end of the rows or half of the columns at the other end of the rows, and the like.

Column processor 26B includes column A/D circuit 25 in half of the columns of pixel circuits 3.

Column processor 26A and column processor 26B are disposed at the ends of the column with pixel array 10 interposed therebetween.

Pixel array 10 includes test region 101A and test region 101B.

Test region 101A includes the above half of the columns of pixel circuits 3 included in at least one row farthest away from column processor 26A.

Test region 101B includes the above half of the columns of pixel circuits 3 included in at least one row farthest away from column processor 26B.

First analog signal A1 is supplied to a drain of reset transistor RS in test region 101A and test region 101B during the one horizontal scanning period included in the vertical blanking interval during the imaging.

Similar to Embodiment 3, this makes it possible to perform not only a fault detection in column A/D circuit 25, but also perform a fault detection in the pixel circuits and a disconnection and short circuit detection in vertical signal lines 19 during the imaging. Additionally, since column processors 26A and 26B of solid-state imaging apparatus 1 in Embodiment 4 operate simultaneously in parallel, solid-state imaging apparatus 1 in Embodiment 4 can be sped up approximately twice as much as in Embodiments 1 to 3.

As described above, in solid-state imaging apparatus 1 in Embodiment 4, column processor 26 includes first column processor 26A in half of the columns of pixel circuits 3 and second column processor 26B in the other half of the columns of pixel circuits 3. First column processor 26A and second column processor 26B are disposed at the ends of the column with pixel array 10 interposed therebetween. Pixel circuits 3 have first test region 101A including pixel circuit 3 for testing purposes corresponding to the half of the columns farthest away from column processor 26A, and a second test region 101B including pixel circuit 3 for testing purposes corresponding to the other half of the columns farthest away from column processor 26B. Pixel circuits 3 each include floating diffusion layer FD that retains signal charge corresponding to the analog pixel signal, reset transistor RS that sets a reset potential in floating diffusion layer FD, and amplification transistor SF that includes a gate connected to floating diffusion layer FD and outputs a potential of the gate to vertical signal lines 19. A source of reset transistor RS is connected to floating diffusion layer FD. First analog signal A1 is supplied to a drain of reset transistor RS in first test region 101A and second test region 101B during the one horizontal scanning period included in the vertical blanking interval during the imaging.

This makes it possible to perform not only a fault detection in column A/D circuit 25, but also perform a fault detection in the pixel circuits and a disconnection and short circuit detection in vertical signal lines 19 during the imaging.

Embodiment 5

Hereinafter, an imaging apparatus according to Embodiment 5 will be described with reference to the drawings. Note that the imaging apparatus in the present embodiment includes at least one solid-state imaging apparatus 1 according to the above Embodiments 1 to 4. This will be described in detail hereinafter.

Figure 14A:
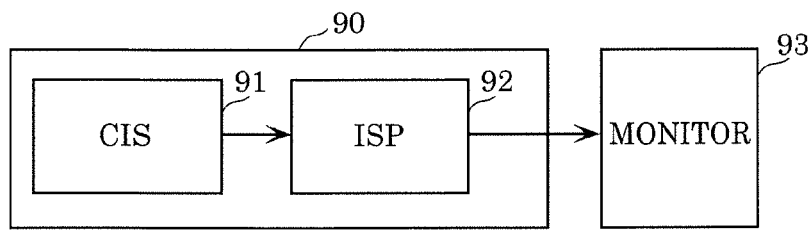
FIG. 14A is a block diagram showing a configuration example of an imaging apparatus according to Embodiment 5.

FIG. 14A is a block diagram showing a configuration example of the imaging apparatus according to Embodiment 5. The imaging apparatus in the drawing includes complementary metal-oxide-semiconductor (CMOS) image sensor (CIS) 91, image signal processor (ISP) 92, and monitor 93, and is, for example, a digital camera or a smartphone camera.

CIS 91 is solid-state imaging apparatus 1 shown in each of the embodiments.

ISP 92 receives a pixel signal from CIS 91 and performs image processing, e.g., enlargement, shrinking, compressing coding and the like.

Monitor 93 serves as confirmation for the user during capturing.

Note that CIS 91 and ISP 92 may be a single system on chip (SoC) 90, and may also be separate chips. When CIS 91 and ISP 92 are separate chips, signal processor 80 may be included in CIS 91 or in ISP 92.

A portion of signal processor 80 may be realized using software and not a circuit.

Figure 14B:
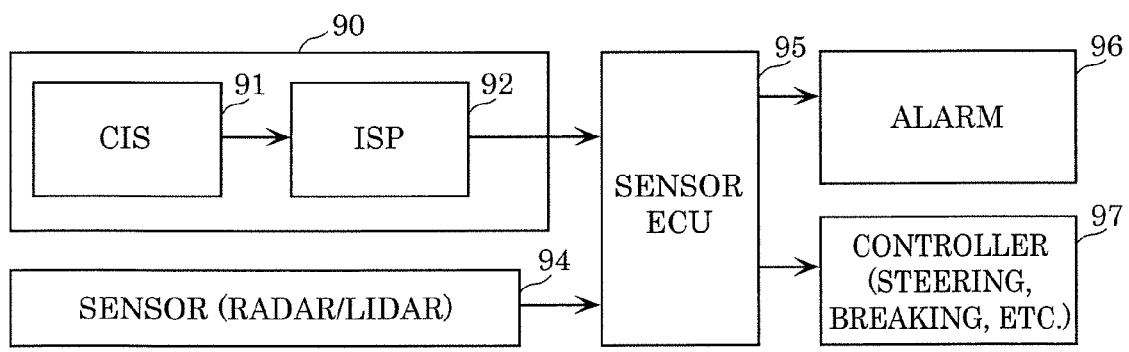
FIG. 14B is a block diagram showing another configuration example of the imaging apparatus according to Embodiment 5.

FIG. 14B is a block diagram showing another configuration example of the imaging apparatus according to Embodiment 5. The imaging apparatus in the drawing includes CIS 91, ISP 92, sensor 94, sensor electronic control unit (ECU) 95, alarm 96, and controller 97, and is, for example, a camera system installed in a vehicle.

CIS 91 and ISP 92 are the same as in FIG. 14A.

Sensor 94 is, for example, a radar sensor for ranging or a light detection and ranging (lidar) sensor for ranging.

Sensor ECU 95 receives a signal from ISP 92 and sensor 94 and controls alarm 96 and controller 97.

Alarm 96 is, for example, a variety of status display lights or warning lights inside an instrument panel of a vehicle.

Controller 97 controls, for example, an actuator and the like that drives steering, breaking, and the like of a vehicle.

Note that the imaging apparatus in FIG. 14B may correspond to a view system, an advanced driver-assistance sensing system, and an automated driving sensing system, may be connected to a monitor in the view system, and may implement a warning or control (steering, breaking, etc.) via a sensor ECU in the sensing system.

Figure 15A:
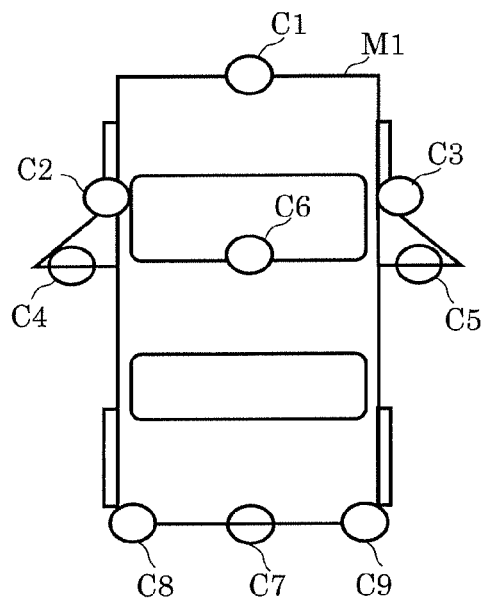
FIG. 15A is a diagram showing an installation example of the imaging apparatus in a vehicle according to Embodiment 5.
Figure 15B:
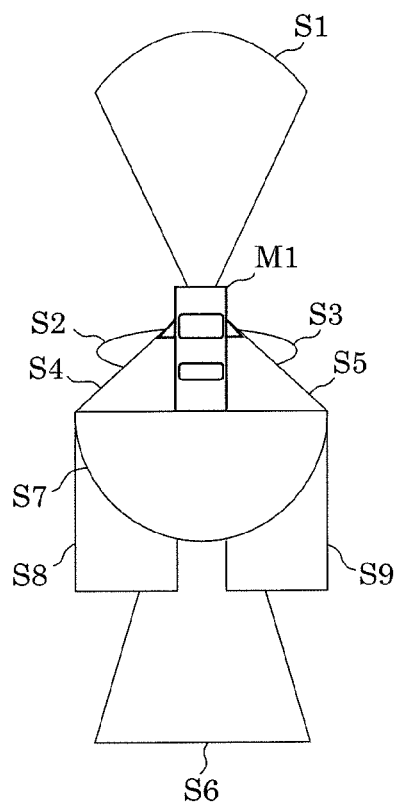
FIG. 15B is a diagram showing an example of a capture range in the installation example in FIG. 15A according to Embodiment 5.

FIG. 15A is a diagram showing an installation example of the imaging apparatus in vehicle M1 according to Embodiment 5. FIG. 15B is a diagram showing an example of a capture range in the installation example in FIG. 15A according to Embodiment 5.

In FIG. 15A, the imaging apparatus in FIG. 14A is, for example, attached to attachment locations C1 to C9. Attachment location C1 is a front portion of vehicle M1. Attachment location C2 is a left side portion of vehicle M1. Attachment location C3 is a right side portion of vehicle M1. Attachment location C4 is a left side door mirror. Attachment location C5 is a right side door mirror. Attachment location C6 is a rear-view mirror. Attachment location C7 is a rear-center portion of vehicle M1. Attachment location C8 is a rear-left side portion of vehicle M1. Attachment location C9 is a rear-right side portion of vehicle M1.

Capture ranges S1 to S9 shown in FIG. 15B correspond to capturing cameras at attachment locations C1 to C9. As illustrated in FIGS. 15A and 15B, the imaging apparatus as viewing camera or sensing camera can be attached to a front, surrounding, side, rear, and intelligent rear of transportation machinery (vehicle, car) depending on the subject range of the capturing.

As described above, the imaging apparatus in Embodiment 5 includes the above imaging apparatus 1, and any one of a view system, an advanced driver-assistance sensing system, and an automated driving sensing system.

The imaging apparatus is installed on at least one of a front-view mirror, a left side mirror, a right side mirror, and a rear-view mirror of transportation machinery.

Other Embodiments

A solid-state imaging apparatus and an imaging apparatus using the solid-state imaging apparatus in the present disclosure has been described based on the above embodiments, but are not limited thereto. Forms realized by optionally combining components and functions in the embodiments, forms obtained by various combinations of the components in the different embodiments that can be conceived by a person skilled in the art which are within the scope of the essence of the present disclosure, and various devices built in the solid-state imaging apparatus and the imaging apparatus using the solid-state imaging apparatus in the present disclosure may also be included in the scope of the one or more aspects of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosre is applicable to a solid-state imaging apparatus and an imaging apparatus.

What is claimed is:

1. A solid-state imaging apparatus, comprising:
   a pixel array including a plurality of pixel circuits arranged in a matrix;
   a column processor including a column analog-to-digital converter (ADC) disposed for each column of the plurality of pixel circuits to convert an analog pixel signal to a digital pixel signal; and
   a test signal generating circuit that generates a first digital signal for testing purposes, wherein
   the test signal generating circuit generates the first digital signal within one horizontal scanning period, and
   the column processor converts a first analog signal, that is converted from the first digital signal, to a second digital signal within the one horizontal scanning period.

2. The solid-state imaging apparatus according to claim 1, wherein
   the one horizontal scanning period is included in a vertical blanking interval during imaging.

3. The solid-state imaging apparatus according to claim 1, wherein
   the column processor further includes
   a test circuit having the same internal configuration as the column ADC, and
   the first analog signal is supplied to the test circuit as a substitute for the analog pixel signal.

4. The solid-state imaging apparatus according to claim 1, further comprising:
   a selector disposed at each column of the plurality of pixel circuits, wherein
   the selector selects and outputs one of the analog pixel signal and the first analog signal.

5. The solid-state imaging apparatus according to claim 4, wherein
   the selector selects the first analog signal in the one horizontal scanning period included in the vertical blanking interval during imaging.

6. The solid-state imaging apparatus according to claim 4, wherein
   the selector selects the analog pixel signal in one horizontal scanning period not included in the vertical blanking interval during imaging.

7. The solid-state imaging apparatus according to claim 1, wherein
   the pixel array has a test region including at least one row of the plurality of pixel circuits,
   the plurality of pixel circuits each include:
      a floating diffusion layer that retains signal charge corresponding to the analog pixel signal; and
      a reset transistor that sets a reset potential in the floating diffusion layer, and
   the first analog signal is supplied to a drain of the reset transistor.

8. The solid-state imaging apparatus according to claim 7, wherein
   the at least one row of the plurality of pixel circuits in the test region includes a row farthest away from the column processor.

9. The solid-state imaging apparatus according to claim 1, further comprising:
   a digital-to-analog converter (DAC) that converts the first digital signal to the first analog signal and supplies the first analog signal to the pixel array or the column processor as a substitute for the analog pixel signal.

10. The solid-state imaging apparatus according to claim 9, wherein
    the DAC adjusts an output gain of the first analog signal so that the first analog signal does not increase beyond an amplitude of a ramp waveform.

11. The solid-state imaging apparatus according to claim 1, wherein
    the test signal generating circuit increases or decreases the first digital signal for each vertical blanking interval during imaging or each horizontal scanning period in the vertical blanking interval during the imaging.

12. The solid-state imaging apparatus according to claim 1, wherein
    the test signal generating circuit generates:
       the first digital signal including a first digital value and a second digital value;
       the first digital value during a reset level readout period within the one horizontal scanning period included in the vertical blanking interval; and
       the second digital value during a signal level readout period within the one horizontal scanning period included in the vertical blanking interval.

13. The solid-state imaging apparatus according to claim 1, further comprising:

a determination circuit that determines whether a difference between the first digital signal and the second digital signal is within an expected value range, and the determination circuit determines that (i) there is no problem when the difference between the first digital signal and the second digital signal is within the expected value range, and (ii) there is a problem when the difference is outside of the expected value range.

14. The solid-state imaging apparatus according to claim 1, wherein the test signal generating circuit increases or decreases the first digital signal by a predetermined degree for each vertical blanking interval during imaging or each horizontal scanning period of the vertical blanking interval during the imaging.

15. An imaging apparatus, comprising:

the solid-state imaging apparatus according to claim 1; and any one of a view system, an advanced driver-assistance sensing system, and an automated driving sensing system.

16. The imaging apparatus according to claim 15, wherein the imaging apparatus is installed on at least one of a front-view mirror, a left side mirror, a right side mirror, and a rear-view mirror of transportation machinery.

\* \* \* \* \*